United States Patent
Kishimura et al.

(10) Patent No.: US 6,737,213 B2
(45) Date of Patent: May 18, 2004

(54) PATTERN FORMATION MATERIAL AND METHOD

(75) Inventors: Shinji Kishimura, Itami (JP); Masaru Sasago, Hirakata (JP); Masamitsu Shirai, Ibaraki (JP); Masahir Tsunooka, Sennan (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/799,017

(22) Filed: Mar. 6, 2001

(65) Prior Publication Data

US 2001/0028989 A1 Oct. 11, 2001

(30) Foreign Application Priority Data

Mar. 14, 2000 (JP) ........................................ 2000-071123

(51) Int. Cl.$^7$ ........................... G03C 1/73; G03F 7/039; G03F 7/20; G03F 7/30
(52) U.S. Cl. .................... 430/270.1; 430/905; 430/910; 430/909; 430/914; 430/325; 430/326; 430/945
(58) Field of Search ............. 430/270.1, 905, 430/910, 914, 909, 325, 326, 945, 907

(56) References Cited

U.S. PATENT DOCUMENTS 4,996,136 A 2/1991 Houlihan et al. ............ 430/313

(List continued on next page.)

FOREIGN PATENT DOCUMENTS

EP 0 813 113 12/1997

(List continued on next page.)

OTHER PUBLICATIONS

Machine–Assisted English Translation (Provided by Japan Patent office) of JP 7–5682 (Oie et al), 1995.

(List continued on next page.)

*Primary Examiner*—Mark F. Huff
*Assistant Examiner*—Sin J. Lee
(74) *Attorney, Agent, or Firm*—Nixon Peabody LLP; Donald R. Studebaker

(57) ABSTRACT

In the pattern formation method of this invention, a resist film is formed by applying, on a substrate, a pattern formation material containing a polymer including a first unit represented by Chemical Formula 1 and a second unit represented by Chemical Formula 2, and an acid generator, Chemical Formula 1

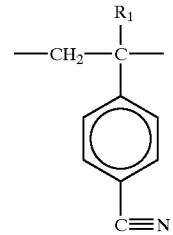

Chemical Formula 2

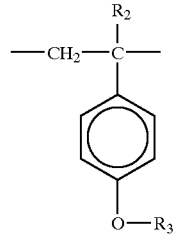

wherein $R_1$ and $R_2$ are the same or different and selected from the group consisting of an alkyl group, a chlorine atom and an alkyl group including a chlorine atom; and $R_3$ is a protecting group released by an acid. Then, the resist film is irradiated with exposing light of a wavelength of a 1 nm through 30 nm band or a 110 nm through 180 nm band for pattern exposure, and a resist pattern is formed by developing the resist film after the pattern exposure.

24 Claims, 2 Drawing Sheets

U.S. PATENT DOCUMENTS 6,004,720 A * 12/1999 Takechi et al. .......... 430/270.1
6,303,266 B1 * 10/2001 Okino et al. ............. 430/270.1

FOREIGN PATENT DOCUMENTS

| | | |
|---|---|---|
| EP | 0 923 115 | 6/1999 |
| EP | 0 942 329 | 9/1999 |
| EP | 0 959 389 | 11/1999 |
| JP | 06289608 A | 10/1994 |
| JP | 06289617 A | 10/1994 |
| JP | 07005682 A | 1/1995 |
| JP | 07181680 A | 7/1995 |
| JP | 10301285 A | 11/1998 |

OTHER PUBLICATIONS

European Search Report, Mailing Date: Aug. 10, 2001.

* cited by examiner

PATTERN FORMATION MATERIAL AND METHOD

BACKGROUND OF THE INVENTION

The present invention relates to pattern formation material and method. More particularly, it relates to a pattern formation method employed for forming a resist pattern, used for forming a semiconductor device or a semiconductor integrated circuit on a semiconductor substrate, by using exposing light of a wavelength of a 1 nm through 30 nm band or a 110 nm through 180 nm band, and a pattern formation material used in the same.

Currently, in fabrication of a mass storage semiconductor integrated circuit, such as a 64 Mbit dynamic random access memory (RAM) and a logic device or a system LSI with a 0.25 µm through 0.15 µm rule, a resist pattern is formed by using a chemically amplified resist material including a polyhydroxystyrene derivative and an acid generator as principal constituents with KrF excimer laser (of a wavelength of a 248 nm band) used as exposing light.

Moreover, for fabrication of a 256 Mbit DRAM, a 1 Gbit DRAM or a system LSI with a 0.15 µm through 0.13 µm rule, a pattern formation method using, as exposing light, ArF excimer laser operated at a shorter wavelength (of a 193 nm band) than the KrF excimer laser is now under development.

The resist material including a polyhydroxystyrene derivative as a principal constituent has high absorbance against light of a wavelength of a 193 nm band because of an aromatic ring included therein. Therefore, exposing light of a 193 nm band cannot uniformly reach the bottom of a resist film, and hence, a pattern cannot be formed in a good shape. Accordingly, the resist material including a polyhydroxystyrene derivative as a principal constituent cannot be used when the ArF excimer laser is used as the exposing light.

Therefore, a chemically amplified resist material including, as a principal constituent, a polyacrylic acid derivative or a polycycloolefin derivative having no aromatic ring is used when the ArF excimer laser is used as the exposing light.

On the other hand, as exposing light for a pattern formation method capable of coping with high resolution, X rays, an electron beam (EB) and the like are being examined.

When the X rays are used as the exposing light, however, there are a large number of problems in the exposure system and preparation of a mask. Also, when the EB is used as the exposing light, the throughput is disadvantageously low, and hence, the EB is not suitable to mass production. Thus, neither the X rays nor the EB is preferred as the exposing light.

Accordingly, in order to form a resist pattern finer than 0.10 µm, it is necessary to use exposing light of a wavelength shorter than that of the ArF excimer laser, such as $Xe_2$ laser (of a wavelength of a 172 nm band), $F_2$ laser (of a wavelength of a 157 nm band), $Kr_2$ laser (of a wavelength of a 146 nm band), ArKr laser (of a wavelength of 134 nm band), $Ar_2$ laser (of a wavelength of a 126 nm band) and soft-X rays (of a wavelength of a 13, 11 or 5 nm band). In other words, a resist pattern is required to be formed by using exposing light of a wavelength of a 1 nm through 30 nm band or a 110 nm through 180 nm band.

Therefore, the present inventors have formed resist patterns by conducting pattern exposure using $F_2$ laser (of a wavelength of a 157 nm band) on resist films formed from conventionally known chemically amplified resist materials respectively including a polyhydroxystyrene derivative represented by Chemical Formula A, a polyacrylic acid derivative represented by Chemical Formula B and a polycycloolefin derivative represented by Chemical Formula C.

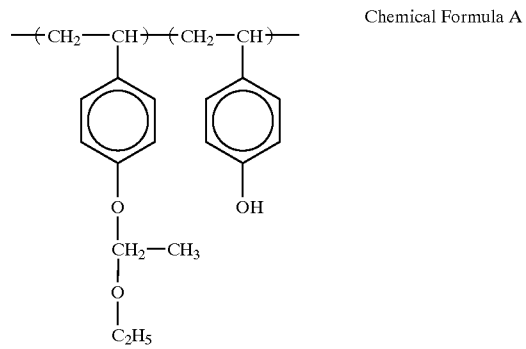

Chemical Formula A

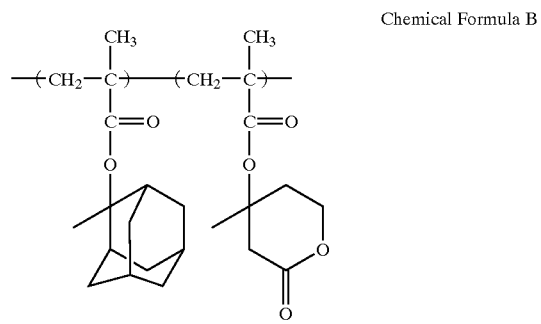

Chemical Formula B

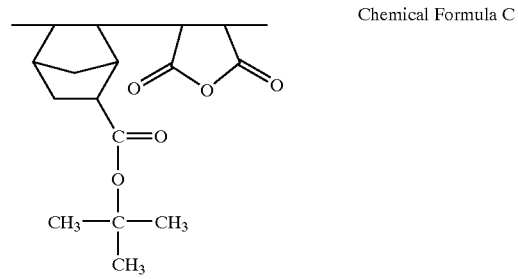

Chemical Formula C

Now, a pattern formation method using any of the aforementioned conventional chemically amplified resist materials and problems of the method will be described with reference to FIGS. 2A through 2D.

First, as is shown in FIG. 2A, the chemically amplified resist material is applied on a semiconductor substrate 1 by spin coating and the resultant substrate is heated, thereby forming a resist film 2 with a thickness of 0.3 µm. Then, as is shown in FIG. 2B, the resist film 2 is subjected to pattern exposure by irradiating with a $F_2$ laser beam 4 through a mask 3. In this manner, an acid is generated from the acid generator in an exposed portion 2a of the resist film 2 but no acid is generated in an unexposed portion 2b of the resist film 2.

Then, as is shown in FIG. 2C, the semiconductor substrate 1 is heated with a hot plate at, for example, 100° C. for 60 seconds.

Next, the resist film 2 is developed with an alkaline developer, thereby forming a resist pattern 5.

However, as is shown in FIG. 2D, the resist pattern 5 has a defective pattern shape, and much scum remains on the semiconductor substrate 1. Such problems occur not only in using the $F_2$ laser as the exposing light but also in using another light of a wavelength of a 1 nm through 30 nm band or a 110 nm through 180 nm band.

Accordingly, a resist pattern cannot be practically formed by irradiating a resist film formed from any of the aforementioned chemically amplified resist materials with light of a wavelength of a 1 nm through 30 nm band or a 110 nm through 180 nm band.

SUMMARY OF THE INVENTION

In consideration of the aforementioned conventional problems, an object of the invention is forming a resist pattern in a good pattern shape with minimally producing scum by using exposing light of a wavelength of a 1 nm through 30 nm band or a 110 nm through 180 nm band.

The present inventors have studied the causes of the conventional problems occurring in using the aforementioned conventional chemically amplified resist materials, and have found the following:

First, the conventional chemically amplified resist materials have high absorbance against light of a wavelength of a 1 nm through 180 nm band. For example, a resist film formed from the chemically amplified resist material including a polyhydroxystyrene derivative as a principal constituent and having a thickness of 100 nm has transmittance of 20% at most against the $F_2$ laser (of a wavelength of a 157 nm band). Therefore, various examination has been made on means for improving the transmittance of a chemically amplified resist material against light of a wavelength of a 1 nm through 180 nm band. As a result, the transmittance of a chemically amplified resist material against light of a wavelength of a 1 nm through 180 nm band can be improved by introducing a unit of a polymer having a cyano group ($-C\equiv N$) on its side chain into a base polymer of the chemically amplified resist material.

Furthermore, when the aforementioned chemically amplified resist materials, particularly the resist material including a polyhydroxystyrene derivative, are irradiated with light of a wavelength of a 1 nm through 180 nm band, a reaction is caused regardless of the function of an acid, so that a hydrogen atom bonded to carbon located at the α-position of the principal chain of the polymer can be released and that polymer radicals from which the hydrogen atoms are released can bond to each other to be crosslinked. As a result, the solubility of an exposed portion of the resist film in a developer is degraded. Therefore, means for preventing the crosslinking reaction of the principal chains of the polymer of the chemically amplified resist material has been variously studied. As a result, it has been found that the crosslinking reaction of the principal chains can be avoided by substituting an alkyl group or a chlorine atom for a hydrogen atom located at the α-position of the principal chain of the polymer.

Moreover, when a cyano group is introduced to a side chain of the polymer, the cyano group interacts with a hydroxyl group based on a hydrogen bond. Therefore, the dry etching resistance and the heat resistance of the resist film can be improved, and an unexposed portion of the resist film can be more effectively prevented from dissolving in a developer, so as to improve the contrast between the exposed portion and the unexposed portion.

The present invention was devised on the basis of the aforementioned findings, and specifically provides pattern formation materials and methods described below.

The first pattern formation material of this invention comprises a polymer including a first unit represented by Chemical Formula 1 and a second unit represented by Chemical Formula 2; and an acid generator,

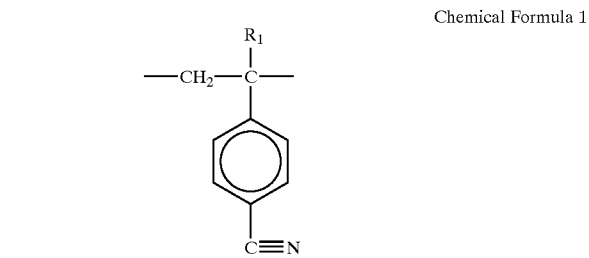

Chemical Formula 1

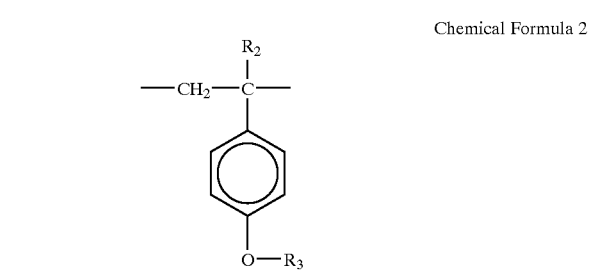

Chemical Formula 2 wherein $R_1$ and $R_2$ are the same or different and selected from the group consisting of an alkyl group such as a methyl group and an ethyl group, a chlorine atom and an alkyl group including a chlorine atom such as $CCl_3$; and $R_3$ is a protecting group released by an acid.

In the first pattern formation material, since the first unit has a cyano group, the transmittance against light of a wavelength of a 1 nm through 180 nm band can be improved, and since an alkyl group, a chlorine atom or an alkyl group including a chlorine atom is substituted for a hydrogen atom located at the α-position of the principal chain of each of the first and second units, a crosslinking reaction is never caused in the principal chains, resulting in improving the solubility of an exposed portion of a resist film in a developer. Furthermore, since the first and second units have a benzene ring, the dry etching resistance can be largely improved.

The second pattern formation material of this invention comprises a polymer including a first unit represented by Chemical Formula 3, a second unit represented by Chemical Formula 4 and a third unit represented by Chemical Formula 5; and an acid generator,

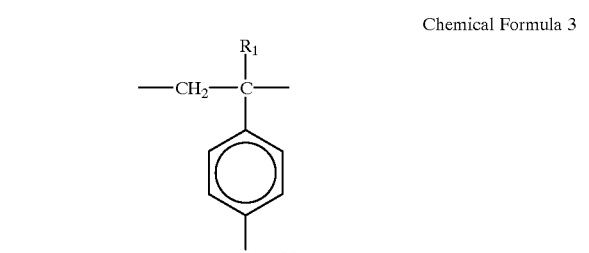

Chemical Formula 3

Chemical Formula 4

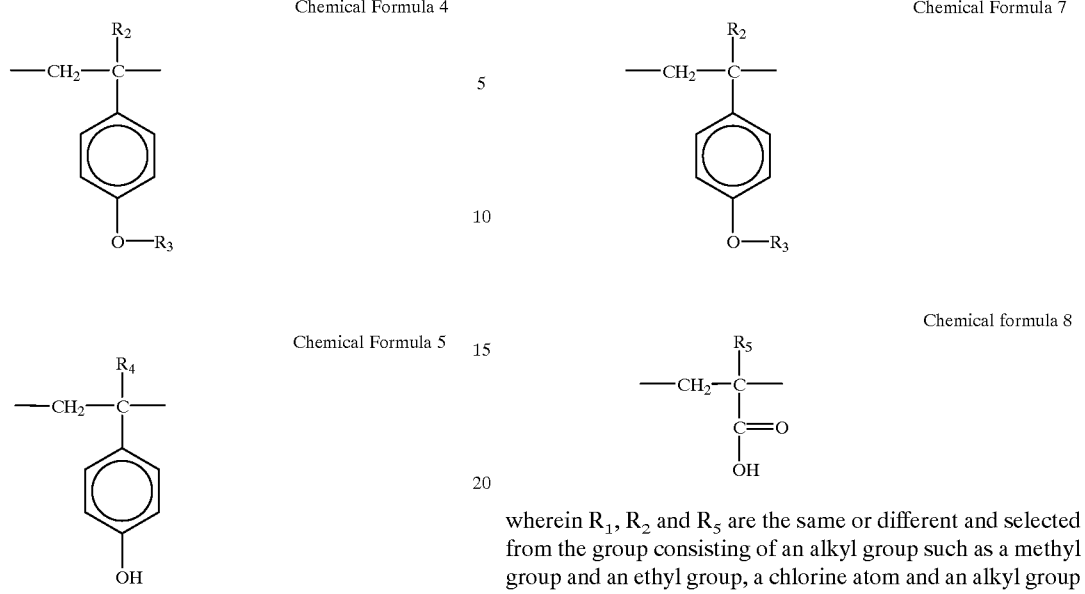

Chemical Formula 5

Chemical Formula 7

Chemical formula 8 wherein $R_1$, $R_2$ and $R_4$ are the same or different and selected from the group consisting of an alkyl group such as a methyl group and an ethyl group, a chlorine atom and an alkyl group including a chlorine atom such as $CCl_3$; and $R_3$ is a protecting group released by an acid.

In the second pattern formation material, since the first unit has a cyano group, the transmittance against light of a wavelength of a 1 nm through 180 nm band can be improved, and since an alkyl group, a chlorine atom or an alkyl group including a chlorine atom is substituted for a hydrogen atom located at the α-position of the principal chain of each of the first, second and third units, a crosslinking reaction is never caused in the principal chains, resulting in improving the solubility of an exposed portion of a resist film in a developer. Furthermore, since the first, second and third units have a benzene ring, the dry etching resistance can be extremely improved. In addition, since the third unit has a phenyl group, the wettability is improved so as to improve adhesion onto a substrate, and the dissolving rate in an alkaline developer can be controlled by adjusting the ratio of the third unit in the polymer.

The third pattern formation material of this invention comprises a polymer including a first unit represented by Chemical Formula 6, a second unit represented by Chemical Formula 7 and a third unit represented by Chemical Formula 8; and an acid generator, Chemical Formula 6 wherein $R_1$, $R_2$ and $R_5$ are the same or different and selected from the group consisting of an alkyl group such as a methyl group and an ethyl group, a chlorine atom and an alkyl group including a chlorine atom such as $CCl_3$; and $R_3$ is a protecting group released by an acid.

In the third pattern formation material, since the first unit has a cyano group, the transmittance against light of a wavelength of a 1 nm through 180 nm band can be improved, and since an alkyl group, a chlorine atom or an alkyl group including a chlorine atom is substituted for a hydrogen atom located at the α-position of the principal chain of each of the first, second and third units, a crosslinking reaction is never caused in the principal chains, resulting in improving the solubility of an exposed portion of a resist film in a developer. Furthermore, since the first and second units have a benzene ring, the dry etching resistance can be largely improved. In addition, since the third unit has a carboxyl group, carboxylic acid is generated in the exposed portion of the resist film through irradiation with light. Therefore, the contrast between the exposed portion and an unexposed portion can be improved.

The fourth pattern formation material of this invention comprises a polymer including a first unit represented by Chemical Formula 9 and a second unit represented by Chemical Formula 10; and an acid generator, Chemical Formula 9

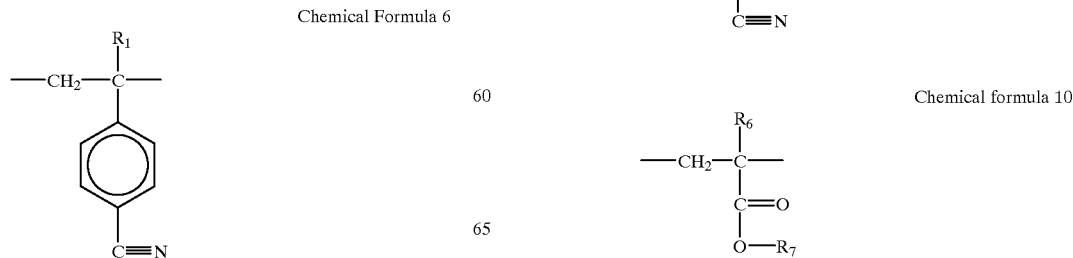

Chemical formula 10 wherein $R_1$ and $R_6$ are the same or different and selected from the group consisting of an alkyl group such as a methyl group and an ethyl group, a chlorine atom and an alkyl group including a chlorine atom such as $CCl_3$; and $R_7$ is a protecting group released by an acid.

In the fourth pattern formation material, since the first unit has a cyano group, the transmittance against light of a wavelength of a 1 nm through 180 nm band can be improved, and since an alkyl group, a chlorine atom or an alkyl group including a chlorine atom is substituted for a hydrogen atom located at the α-position of the principal chain of each of the first and second units, a crosslinking reaction is never caused in the principal chains, resulting in improving the solubility of an exposed portion of a resist film in a developer. Also, since the first unit has a benzene ring, the dry etching resistance can be improved. Furthermore, when an acid is generated through irradiation with light and the protecting group is released from the second unit, carboxylic acid is generated in the exposed portion of the resist film. Therefore, the contrast between the exposed portion and an unexposed portion can be improved.

The fifth pattern formation material of this invention comprises a polymer including a first unit represented by Chemical Formula 11, a second unit represented by Chemical Formula 12 and a third unit represented by Chemical Formula 13; and an acid generator,

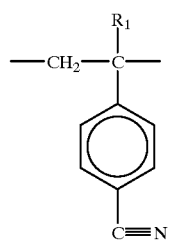

Chemical Formula 11

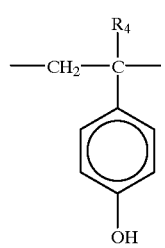

Chemical Formula 12

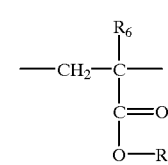

Chemical formula 13 wherein $R_1$, $R_4$ and $R_6$ are the same or different and selected from the group consisting of an alkyl group such as a methyl group and an ethyl group, a chlorine atom and an alkyl group including a chlorine atom such as $CCl_3$; and $R_7$ is a protecting group released by an acid.

In the fifth pattern formation material, since the first unit has a cyano group, the transmittance against light of a wavelength of a 1 nm through 180 nm band can be improved, and since an alkyl group, a chlorine atom or an alkyl group including a chlorine atom is substituted for a hydrogen atom located at the α-position of the principal chain of each of the first, second and third units, a crosslinking reaction is never caused in the principal chains, resulting in improving the solubility of an exposed portion of a resist film in a developer. Furthermore, since the first and second units have a benzene ring, the dry etching resistance can be largely improved, and since the second unit has a phenyl group, the wettability is improved so as to improve adhesion onto a substrate. Moreover, the dissolving rate in an alkaline developer can be controlled by adjusting the ratio of the second unit in the polymer. Furthermore, when an acid is generated through irradiation with light and the protecting group is released from the third unit, carboxylic acid is generated in the exposed portion of the resist film. Therefore, the contrast between the exposed portion and an unexposed portion can be improved.

The sixth pattern formation material of this invention comprises a polymer including a first unit represented by Chemical Formula 14, a second unit represented by Chemical Formula 15 and a third unit represented by Chemical Formula 16; and an acid generator,

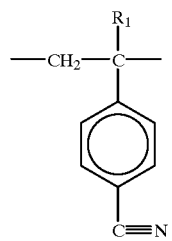

Chemical Formula 14

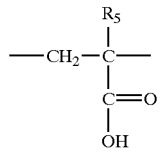

Chemical Formula 15

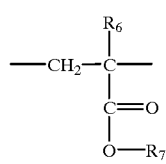

Chemical Formula 16 wherein $R_1$, $R_5$ and $R_6$ are the same or different and selected from the group consisting of an alkyl group such as a methyl group and an ethyl group, a chlorine atom and an alkyl group including a chlorine atom such as $CCl_3$; and $R_7$ is a protecting group released by an acid.

In the sixth pattern formation material, since the first unit has a cyano group, the transmittance against light of a wavelength of a 1 nm through 180 nm band can be improved, and since an alkyl group, a chlorine atom or an alkyl group including a chlorine atom is substituted for a hydrogen atom located at the α-position of the principal chain of each of the first, second and third units, a crosslinking reaction is never caused in the principal chains, resulting in improving the solubility of an exposed portion of a resist film in a developer. Also, since the first unit has a benzene ring, the dry etching resistance can be improved. Furthermore, since the second unit has a carboxyl group, carboxylic acid is generated in the exposed portion of the resist film from the second unit through irradiation with light, and when an acid is generated through irradiation with light and the protecting group is released from the third unit, carboxylic acid is generated. Therefore, the contrast between the exposed portion and an unexposed portion can be largely improved.

Specific examples of the protecting group released by an acid represented by $R_3$ in the aforementioned formulas are represented by Chemical Formula D:

Chemical Formula D

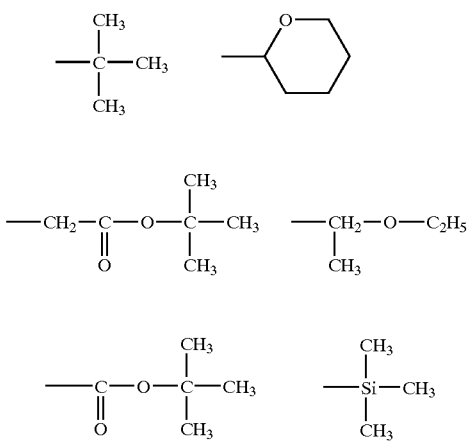

Specific examples of the protecting group released by an acid represented by $R_7$ in the aforementioned formulas are represented by Chemical Formula E:

Chemical Formula E

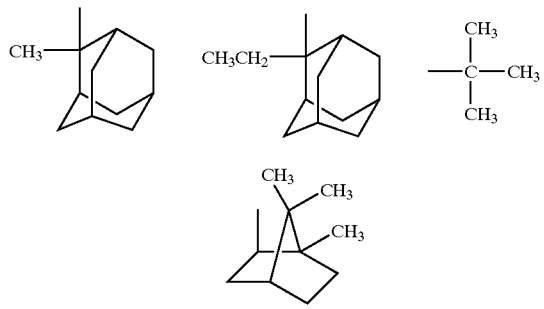

The first pattern formation method of this invention comprises the steps of forming a resist film by applying, on a substrate, the first pattern formation material; irradiating the resist film with exposing light of a wavelength of a 1 nm through 30 nm band or a 110 nm through 180 nm band for pattern exposure; and forming a resist pattern by developing the resist film after the pattern exposure.

In the first pattern formation method, the first pattern formation material is used, and hence, the transmittance against light of a wavelength of a 1 nm through 180 nm band can be improved and the solubility of an exposed portion of the resist film in a developer can be improved. Furthermore, the dry etching resistance can be largely improved.

The second pattern formation method of this invention comprises the steps of forming a resist film by applying, on a substrate, the second pattern formation material; irradiating the resist film with exposing light of a wavelength of a 1 nm through 30 nm band or a 110 nm through 180 nm band for pattern exposure; and forming a resist pattern by developing the resist film after the pattern exposure.

In the second pattern formation method, the second pattern formation material is used, and hence, the transmittance against light of a wavelength of a 1 nm through 180 nm band can be improved and the solubility of an exposed portion of the resist film in a developer can be improved. Furthermore, the dry etching resistance can be largely improved. In addition, the wettability of the pattern formation material is improved so as to improve the adhesion onto the substrate, and the dissolving rate in an alkaline developer can be controlled by adjusting the ratio of the third unit in the polymer.

The third pattern formation method of this invention comprises the steps of forming a resist film by applying, on a substrate, the third pattern formation material; irradiating the resist film with exposing light of a wavelength of a 1 nm through 30 nm band or a 110 nm through 180 nm band for pattern exposure; and forming a resist pattern by developing the resist film after the pattern exposure.

In the third pattern formation method, the third pattern formation material is used, and hence, the transmittance against light of a wavelength of a 1 nm through 180 nm band can be improved and the solubility of an exposed portion of the resist film in a developer can be improved. Furthermore, the dry etching resistance can be largely improved. In addition, since carboxylic acid is generated in the exposed portion of the resist film through irradiation with light, the contrast between the exposed portion and an unexposed portion can be improved.

The fourth pattern formation method of this invention comprises the steps of forming a resist film by applying, on a substrate, the fourth pattern formation material; irradiating the resist film with exposing light of a wavelength of a 1 nm through 30 nm band or a 110 nm through 180 nm band for pattern exposure; and forming a resist pattern by developing the resist film after the pattern exposure.

In the fourth pattern formation method, the fourth pattern formation material is used, and hence, the transmittance against light of a wavelength of a 1 nm through 180 nm band can be improved and the solubility of an exposed portion of the resist film in a developer can be improved. Also, the dry etching resistance can be largely improved. Furthermore, since carboxylic acid is generated in the exposed portion of the resist film through irradiation with light, the contrast between the exposed portion and an unexposed portion can be improved.

The fifth pattern formation method of this invention comprises the steps of forming a resist film by applying, on a substrate, the fifth pattern formation material; irradiating the resist film with exposing light of a wavelength of a 1 nm through 30 nm band or a 110 nm through 180 nm band for pattern exposure; and forming a resist pattern by developing the resist film after the pattern exposure.

In the fifth pattern formation method, the fifth pattern formation material is used, and hence, the transmittance against light of a wavelength of a 1 nm through 180 nm band can be improved and the solubility of an exposed portion of the resist film in a developer can be improved. Furthermore, the dry etching resistance can be largely improved. In addition, the wettability of the pattern formation material is improved so as to improve the adhesion onto the substrate, and the dissolving rate in an alkaline developer can be controlled by adjusting the ratio of the third unit in the polymer. Moreover, since carboxylic acid is generated in the exposed portion of the resist film through irradiation with light, the contrast between the exposed portion and an unexposed portion can be improved.

The sixth pattern formation method of this invention comprises the steps of forming a resist film by applying, on a substrate, the sixth pattern formation material; irradiating the resist film with exposing light of a wavelength of a 1 nm through 30 nm band or a 110 nm through 180 nm band for pattern exposure; and forming a resist pattern by developing the resist film after the pattern exposure.

In the sixth pattern formation method, the sixth pattern formation material is used, and hence, the transmittance against light of a wavelength of a 1 nm through 180 nm band can be improved and the solubility of an exposed portion of a resist film in a developer can be improved. Also, the dry etching resistance can be largely improved. Furthermore, since a large amount of carboxylic acid is generated in the exposed portion of the resist film through irradiation with light, the contrast between the exposed portion and an unexposed portion can be largely improved.

In any of the first through sixth pattern formation methods, the exposing light is preferably $F_2$ excimer laser, $Ar_2$ excimer laser or soft-X rays.

DETAILED DESCRIPTION OF THE INVENTION

Embodiment 1

A pattern formation material and a pattern formation method according to Embodiment 1 of the invention will now be described with reference to FIGS. 1A through 1D.

In this embodiment, the first pattern formation material and the first pattern formation method described above are embodied, and the specific composition of a resist material of this embodiment is as follows:

Base polymer: a polymer represented by Chemical Formula F below

Acid generator: triphenylsulfonium triflate (1 wt % based on the base polymer)

Solvent: diglime

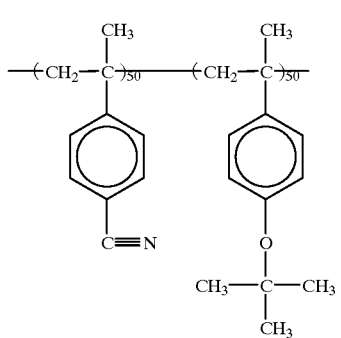

Chemical Formula F

Figure 1A:
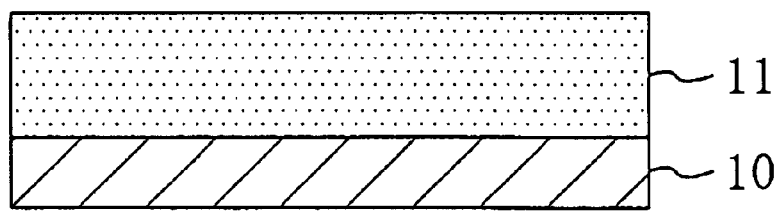
FIGS. 1A, 1B, 1C and 1D are cross-sectional views for showing procedures in a pattern formation method according to any of Embodiments 1 through 6 of the invention.

First, as is shown in FIG. 1A, the resist material having the above-described composition is applied on a semiconductor substrate 10 by spin coating, thereby forming a resist film 11 with a thickness of 0.2 μm. At this point, since the base polymer is alkali-refractory, the resist film 11 is alkali-refractory.

Figure 1B:
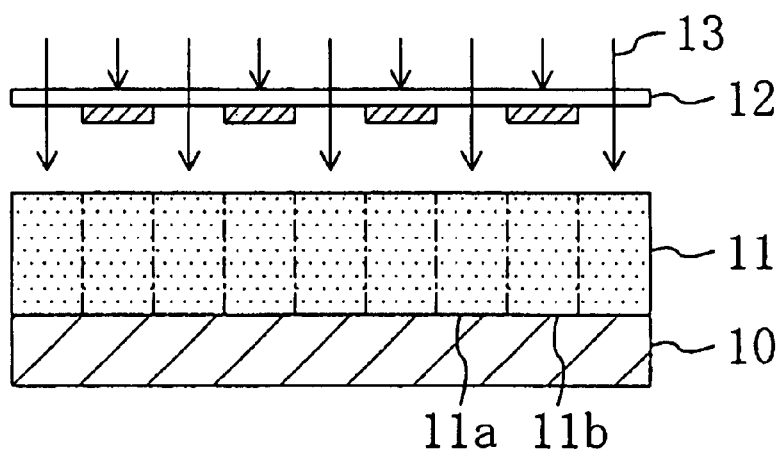

Next, as is shown in FIG. 1B, the resist film 11 is subjected to pattern exposure by irradiating through a mask 12 with $F_2$ excimer laser 13 (of a wavelength of a 157 nm band). Thus, an acid is generated from the acid generator in an exposed portion 11a of the resist film 11 while no acid is generated in an unexposed portion 11b of the resist film 11.

Figure 1C:
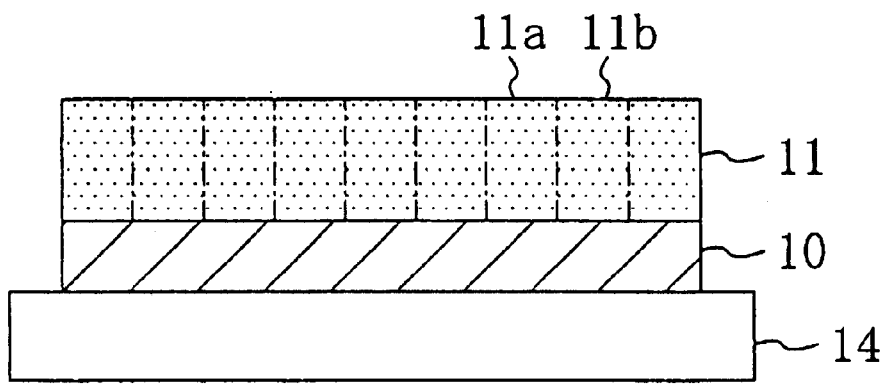

Then, as is shown in FIG. 1C, the semiconductor substrate 10 together with the resist film 11 is heated with a hot plate 14. Thus, the base polymer is heated in the presence of the acid in the exposed portion 11a of the resist film 11, so as to release a protecting group of a unit on the right hand side in Chemical Formula 19. As a result, the base polymer becomes alkali-soluble.

Figure 1D:
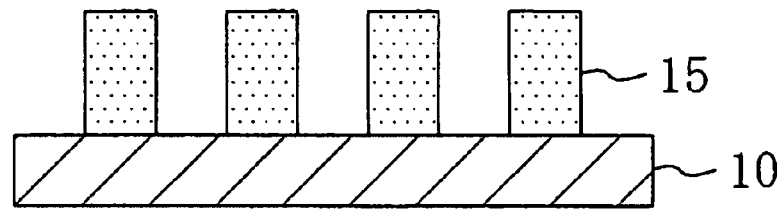
Figure 2A:
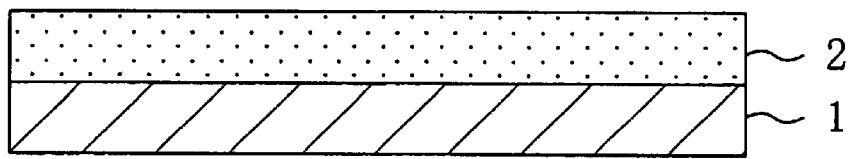
FIGS. 2A, 2B, 2C and 2D are cross-sectional views for showing procedures in a conventional pattern formation method.
Figure 2B:
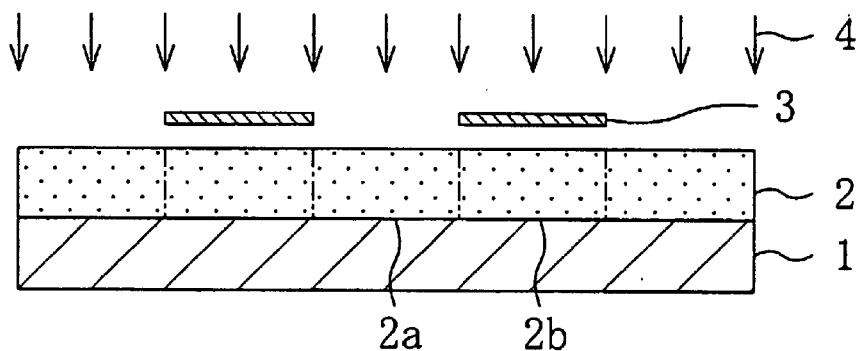
Figure 2C:
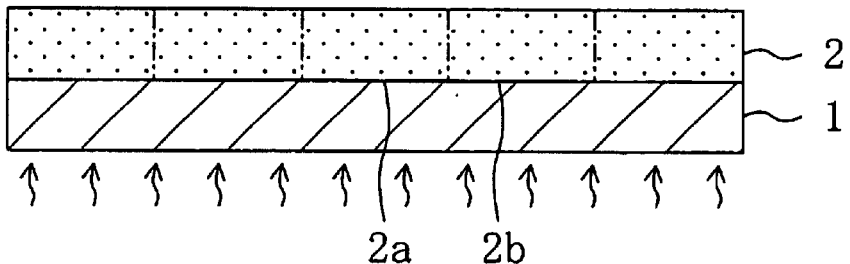
Figure 2D:
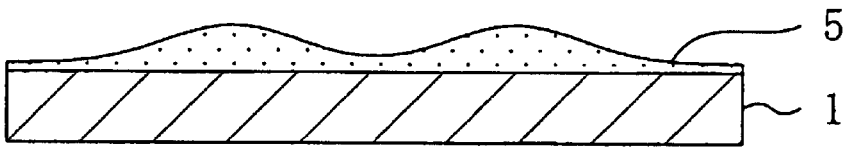

Subsequently, the resist film 11 is developed with an alkaline developer such as a tetramethylammonium hydroxide aqueous solution. Thus, the exposed portion 11a of the resist film 11 is dissolved in the developer, so that a resist pattern 15 can be formed from the unexposed portion 11b of the resist film 11 as is shown in FIG. 1D.

Embodiment 2

A pattern formation material and a pattern formation method according to Embodiment 2 of the invention will now be described. Embodiment 2 is different from Embodiment 1 in the resist material alone, and hence, the resist material alone will be herein described.

In this embodiment, the second pattern formation material and the second pattern formation method described above are embodied, and the specific composition of the resist material is as follows:

Base polymer: a polymer represented by Chemical Formula G below

Acid generator: triphenylsulfonium triflate (1 wt % based on the base polymer)

Solvent: diglime

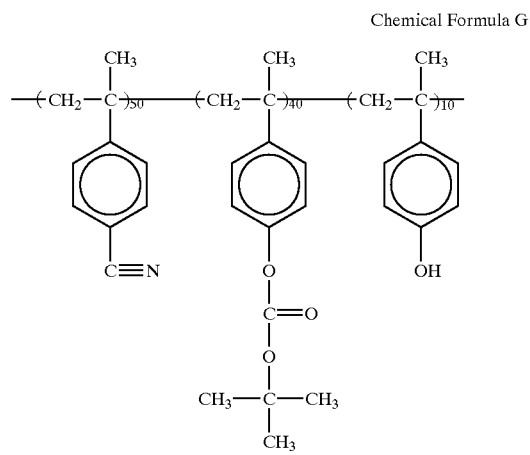

Chemical Formula G

Embodiment 3

A pattern formation material and a pattern formation method according to Embodiment 3 of the invention will now be described. Embodiment 3 is different from Embodiment 1 in the resist material alone, and hence, the resist material alone will be herein described.

In this embodiment, the third pattern formation material and the third pattern formation method described above are embodied, and the specific composition of the resist material is as follows:

Base polymer: a polymer represented by Chemical Formula H below

Acid generator: triphenylsulfonium triflate (1 wt % based on the base polymer)

Solvent: diglime

Chemical Formula H

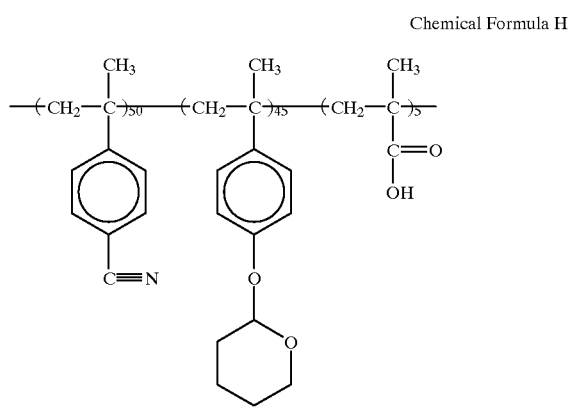

Embodiment 4

A pattern formation material and a pattern formation method according to Embodiment 4 of the invention will now be described. Embodiment 4 is different from Embodiment 1 in the resist material alone, and hence, the resist material alone will be herein described.

In this embodiment, the fourth pattern formation material and the fourth pattern formation method described above are embodied, and the specific composition of the resist material is as follows:

Base polymer: a polymer represented by Chemical Formula I below

Acid generator: triphenylsulfonium triflate (1 wt % based on the base polymer)

Solvent: diglime

Chemical Formula I

Embodiment 5

A pattern formation material and a pattern formation method according to Embodiment 5 of the invention will now be described. Embodiment 5 is different from Embodiment 1 in the resist material alone, and hence, the resist material alone will be herein described.

In this embodiment, the fifth pattern formation material and the fifth pattern formation method described above are embodied, and the specific composition of the resist material is as follows:

Base polymer: a polymer represented by Chemical Formula J below

Acid generator: triphenylsulfonium triflate (1 wt % based on the base polymer)

Solvent: diglime

Chemical Formula J

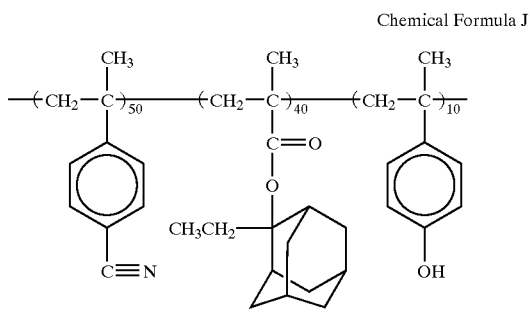

Embodiment 6

A pattern formation material and a pattern formation method according to Embodiment 6 of the invention will now be described. Embodiment 6 is different from Embodiment 1 in the resist material alone, and hence, the resist material alone will be herein described.

In this embodiment, the sixth pattern formation material and the sixth pattern formation method described above are embodied, and the specific composition of the resist material is as follows:

Base polymer: a polymer represented by Chemical Formula K below

Acid generator: triphenylsulfonium triflate (1 wt % based on the base polymer)

Solvent: diglime

Chemical Formula K

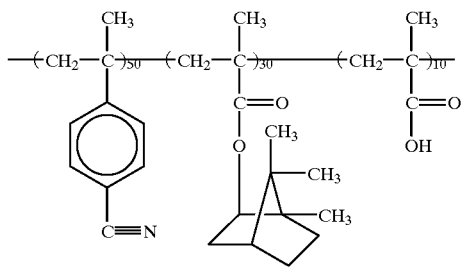

What is claimed is:

1. A pattern formation material comprising:

a polymer including a first unit represented by Chemical Formula 1 and a second unit represented by Chemical Formula 2; and an acid generator, Chemical Formula 1

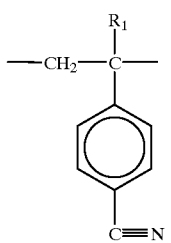

Chemical Formula 2

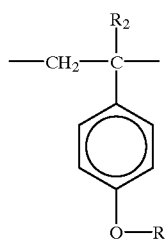

wherein $R_1$ and $R_2$ are the same or different and selected from the group consisting of an alkyl group, a chlorine atom and an alkyl group including a chlorine atom; $R_3$ is one of the following protecting groups,

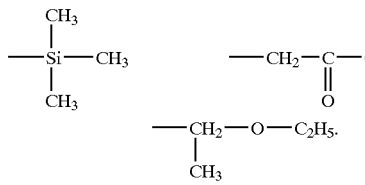

2. A pattern formation material comprising:
a polymer including a first unit represented by Chemical Formula 3 and a second unit represented by Chemical Formula 4 and a third unit represented by Chemical Formula 5; and
an acid generator, Chemical Formula 3

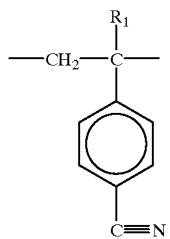

Chemical Formula 4

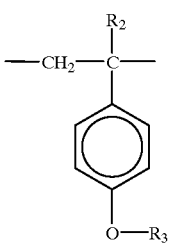

Chemical Formula 5

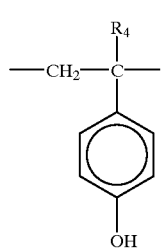

wherein $R_1$, $R_2$ and $R_4$ are the same or different and selected from the group consisting of an alkyl group, a chlorine atom and an alkyl group including a chlorine atom; $R_3$ is a protecting group released by an acid.

3. The pattern formation material of claim 2, wherein $R_3$ is one of the following protecting groups:

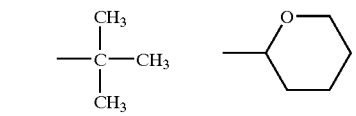

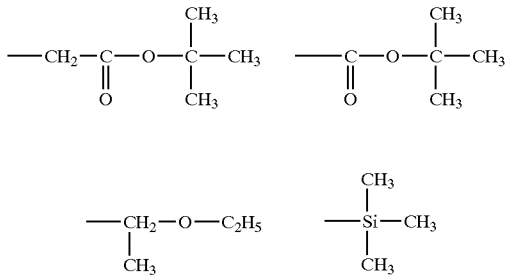

4. A pattern formation material comprising:
a polymer including a first unit represented by Chemical Formula 6 and a second unit represented by Chemical Formula 7 and a third unit represented by Chemical Formula 8; and Chemical Formula 6

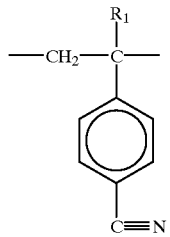

an acid generator,

Chemical Formula 7

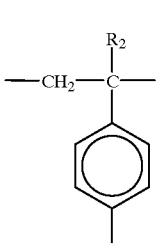

Chemical Formula 8

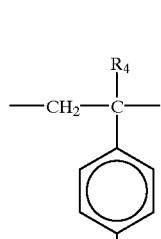

wherein $R_1$, $R_2$ and $R_5$ are the same or different and selected from the group consisting of an alkyl group, a chlorine atom and an alkyl group including a chlorine atom; $R_3$ is a protecting group released by an acid.

5. The pattern formation material of claim 4, wherein $R_3$ is one of the following protecting groups:

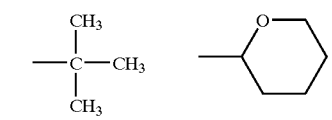

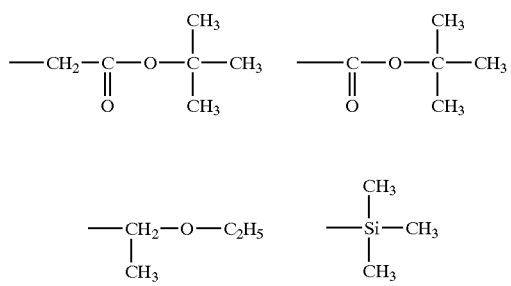

6. A pattern formation method comprising the steps of:

forming a resist film by applying, on a substrate, a pattern formation material containing a polymer including a first unit represented by Chemical Formula 17 and a second unit represented by Chemical Formula 18; and an acid generator, Chemical Formula 17

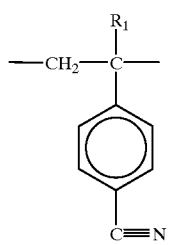

Chemical Formula 18

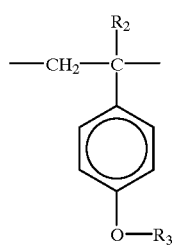

wherein $R_1$ and $R_2$ are the same or different and selected from the group consisting of an alkyl group, a chlorine atom and an alkyl group including a chlorine atom; $R_3$ is a protecting group released by an acid;

irradiating said resist film with exposing light of a wavelength of a 1 nm through 30 nm band or a 110 nm through 180 nm band for pattern exposure; and forming a resist pattern by developing said resist film after the pattern exposure.

7. The pattern formation method of claim 6, wherein said exposing light is $Xe_2$ laser, $F_2$ laser, Kr2 laser, ArKr laser or $Ar_2$ laser.

8. The pattern formation method of claim 6, wherein $R_3$ is one of the following protecting groups:

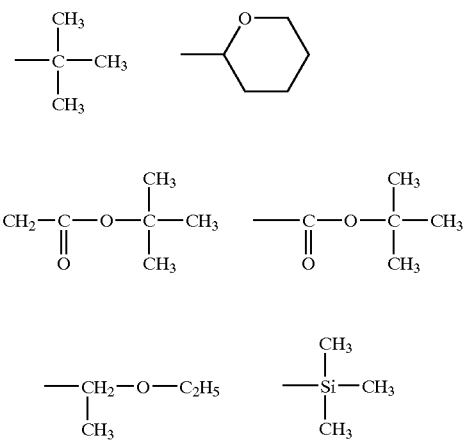

9. The pattern formation method of claim 6, wherein said polymer is

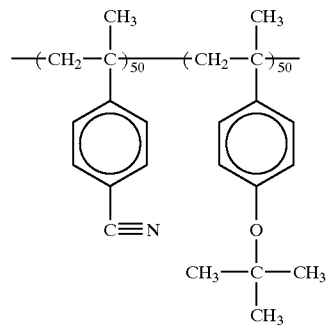

10. The pattern formation method of claim 6, wherein said acid generator is triphenysulfonium triflate.

11. A pattern formation method comprising the steps of:

forming a resist film by applying, on a substrate, a pattern formation material containing a polymer including a first unit represented by Chemical Formula 19, a second unit represented by Chemical Formula 20 and a third unit represented by Chemical Formula 21; and an acid generator, Chemical Formula 19

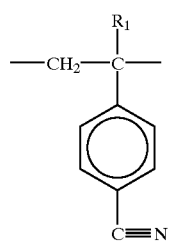

Chemical Formula 20

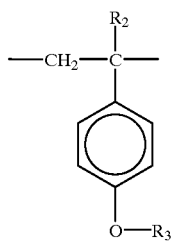

Chemical Formula 21

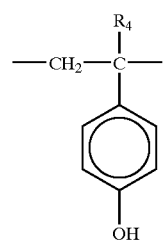

wherein $R_1$, $R_2$ and $R_4$ are the same or different and selected from the group consisting of an alkyl group, a chlorine atom and an alkyl group including a chlorine atom; $R_3$ is a protecting group released by an acid;

irradiating said resist film with exposing light of a wavelength of a 1 nm through 30 nm band or a 110 nm through 180 nm band for pattern exposure; and forming a resist pattern by developing said resist film after the pattern exposure.

12. The pattern formation method of claim 11, wherein said exposing light is $Xe_2$ laser, $F_2$ laser, $Kr_2$ laser, ArKr laser or $Ar_2$ laser.

13. The pattern formation method of claim 11, wherein $R_3$ is one of the following protecting groups:

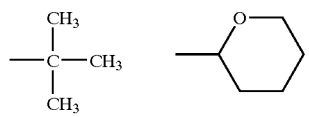

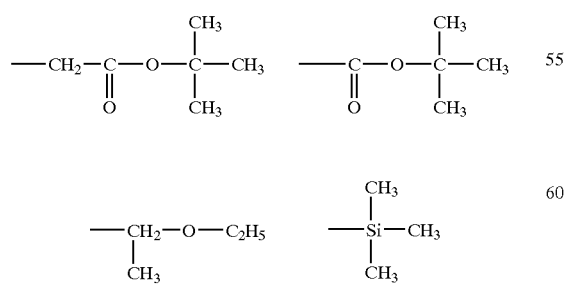

14. The pattern formation method of claim 11, wherein said polymer is

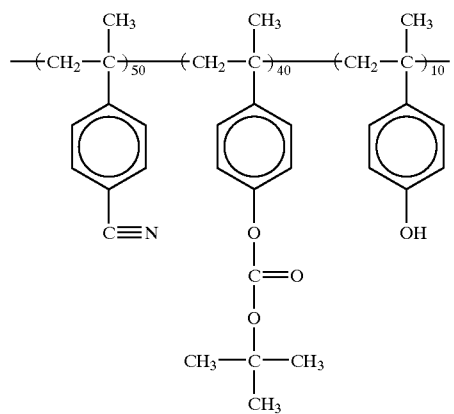

15. A pattern formation method comprising the steps of:

forming a resist film by applying, on a substrate, a pattern formation material containing a polymer including a first unit represented by Chemical Formula 22, a second unit represented by Chemical Formula 23 and a third unit represented by Chemical Formula 24; and an acid generator, Chemical Formula 22

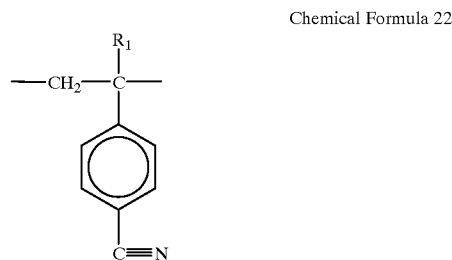

Chemical Formula 23

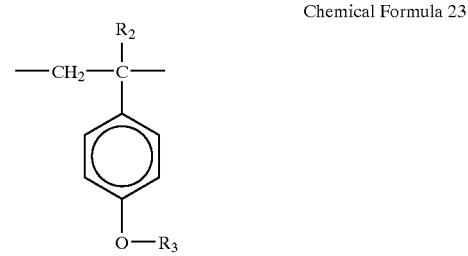

Chemical Formula 24

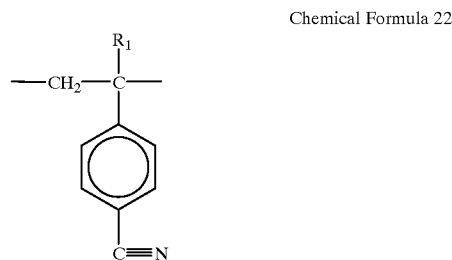

wherein $R_1$, $R_2$ and $R_5$ are the same or different and selected from the group consisting of an alkyl group, a chlorine atom and an alkyl group including a chlorine atom; $R_3$ is a protecting group released by an acid;

irradiating said resist film with exposing light of a wavelength of a 1 nm through 30 nm band or a 110 nm through 180 nm band for pattern exposure; and forming a resist pattern by developing said resist film after the pattern exposure.

16. The pattern formation method of claim 15, wherein said exposing light is $Xe_2$ laser, $F_2$ laser, $Kr_2$ laser, ArKr laser or $Ar_2$ laser.

17. The pattern formation method of claim 15, wherein $R_3$ is one of the following protecting groups:

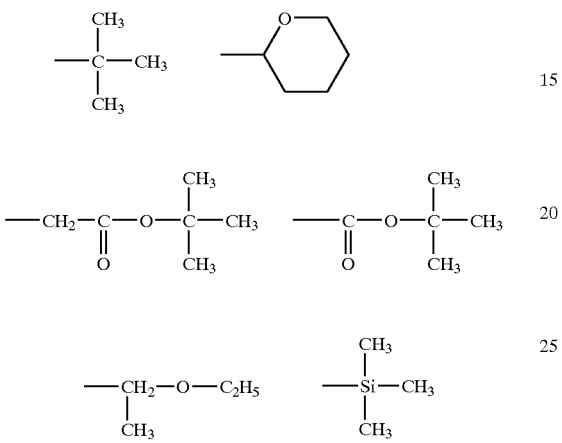

18. The pattern formation method of claim 15, wherein said polymer is

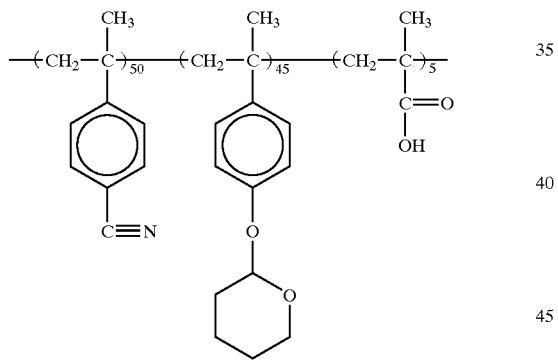

19. A pattern formation method comprising the steps of:

forming a resist film by applying, on a substrate, a pattern formation material containing a polymer; and an acid generator, wherein said polymer is

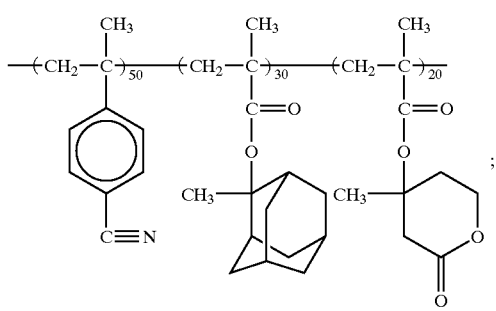

irradiating said resist film with exposing light of a wavelength of a 1 nm through 30 nm band or a 110 nm through 180 nm band for pattern exposure; and forming a resist pattern by developing said resist film after the pattern exposure.

20. The pattern formation method of claim 19, wherein said exposing light is $Xe_2$ laser, $F_2$ laser, $Kr_2$ laser, ArKr laser or $Ar_2$ laser.

21. A pattern formation method comprising the steps of:

forming a resist film by applying, on a substrate, a pattern formation material containing a polymer; and an acid generator, wherein said polymer is

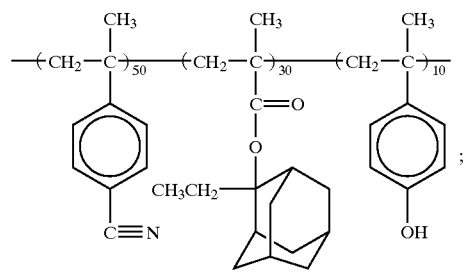

irradiating said resist film with exposing light of a wavelength of a 1 nm through 30 nm band or a 110 nm through 180 nm band for pattern exposure; and forming a resist pattern by developing said resist film after the pattern exposure.

22. The pattern formation method of claim 21, wherein said exposing light is $Xe_2$ laser, $F_2$ laser, $Kr_2$ laser, ArKr laser or $Ar_2$ laser.

23. A pattern formation method comprising the steps of:

forming a resist film by applying, on a substrate, a pattern formation material containing a polymer; and an acid generator, wherein said polymer is

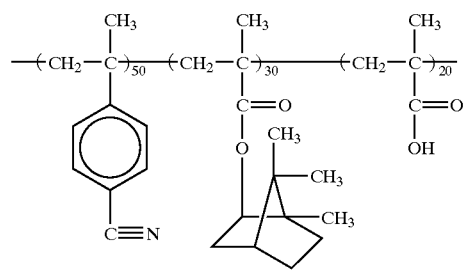

irradiating said resist film with exposing light of a wavelength of a 1 nm through 30 nm band or a 110 nm through 180 nm band for pattern exposure; and forming a resist pattern by developing said resist film after the pattern exposure.

24. The pattern formation method of claim 23, wherein said exposing light is $Xe_2$ laser, $F_2$ laser, $Kr_2$ laser, ArKr laser or $Ar_2$ laser.

* * * * *

UNITED STATES PATENT AND TRADEMARK OFFICE
CERTIFICATE OF CORRECTION

PATENT NO. : 6,737,213 B2
DATED : May 18, 2004
INVENTOR(S) : Shinji Kishimura et al.

It is certified that error appears in the above-identified patent and that said Letters Patent is hereby corrected as shown below:

Title page,
Item [75], Inventors, "Shinji Kishimura"; please delete "Itami (JP)" and insert -- Hyogo (JP) --.
"Masaru Sasago"; please delete "Hirakata (JP)" and insert -- Osaka (JP) --.
"Masamitsu Shirai"; please delete "Ibaraki (JP)" and insert -- Osaka (JP) --.
"Masahir Tsunooka"; please delete "Sennan (JP)" and insert -- Osaka (JP) --.

Column 16,
Line 42, -- an acid generator, -- should be put above Chemical Formula 6.

Column 18,
Line 2, "Kr2" should be -- $Kr_2$ --.

Column 22,
Line 50, the chemical formula should be followed by a semicolon.

Signed and Sealed this

Twenty-eighth Day of December, 2004

JON W. DUDAS
*Director of the United States Patent and Trademark Office*